United States Patent [19]

Nagy et al.

[11] Patent Number: 4,633,371
[45] Date of Patent: Dec. 30, 1986

[54] HEAT PIPE HEAT EXCHANGER FOR LARGE SCALE INTEGRATED CIRCUITS

[75] Inventors: John S. Nagy, Los Altos; Jolson K. Fang, Sunnyvale, both of Calif.

[73] Assignee: Amdahl Corporation, Sunnyvale, Calif.

[21] Appl. No.: 650,683

[22] Filed: Sep. 17, 1984

[51] Int. Cl.⁴ .............................................. H05K 7/20
[52] U.S. Cl. .................................... 361/385; 361/384; 165/104.33
[58] Field of Search ................... 174/15 HP; 361/385, 361/386, 388, 382, 383, 384; 357/82; 165/122, 104.33

[56] References Cited

U.S. PATENT DOCUMENTS

| | | | |
|---|---|---|---|
| 2,380,026 | 7/1945 | Clarke | 361/384 |
| 3,942,586 | 3/1976 | Fries | 165/104.33 |
| 4,115,837 | 9/1978 | Beall | 361/388 |
| 4,145,708 | 3/1979 | Ferro | 357/82 |
| 4,161,980 | 7/1979 | Ruger | 357/82 |
| 4,173,996 | 11/1979 | Pierce | 357/82 |
| 4,449,164 | 5/1984 | Carlson | 361/384 |

OTHER PUBLICATIONS

IBM Tech. Discl. Bull., vol. 23, No. 4, Sep. 1980, p. 1445, "Water-Cooled Heat Transfer Plate", Christensen.

Primary Examiner—G. P. Tolin
Attorney, Agent, or Firm—Fliesler, Dubb, Meyer & Lovejoy

[57] ABSTRACT

Disclosed is a heat pipe heat exchanger for large scale integrated circuits. The heat pipe means is mounted on the substrate which supports the integrated circuit. The heat is conducted by the heat pipe means away from the integrated circuit to a surface area for dissipating heat. A plenum supplies a cooling medium across the surface area of the heat pipe means for removing the heat. An enclosing means for enclosing the surface area of the heat pipe means forms channels across the surface area for receiving the cooling medium supplied from the plenum.

21 Claims, 3 Drawing Figures

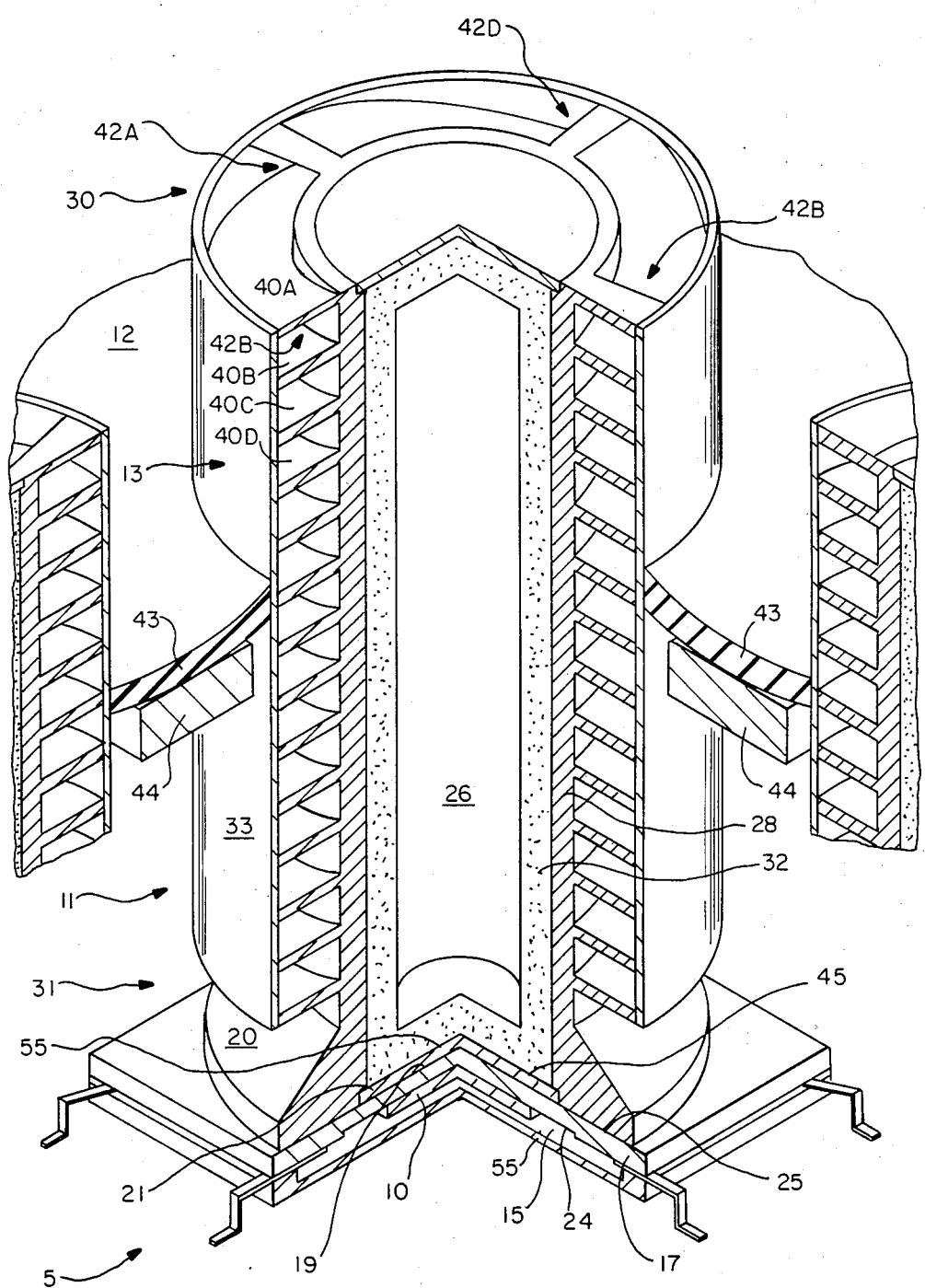
FIG.—2

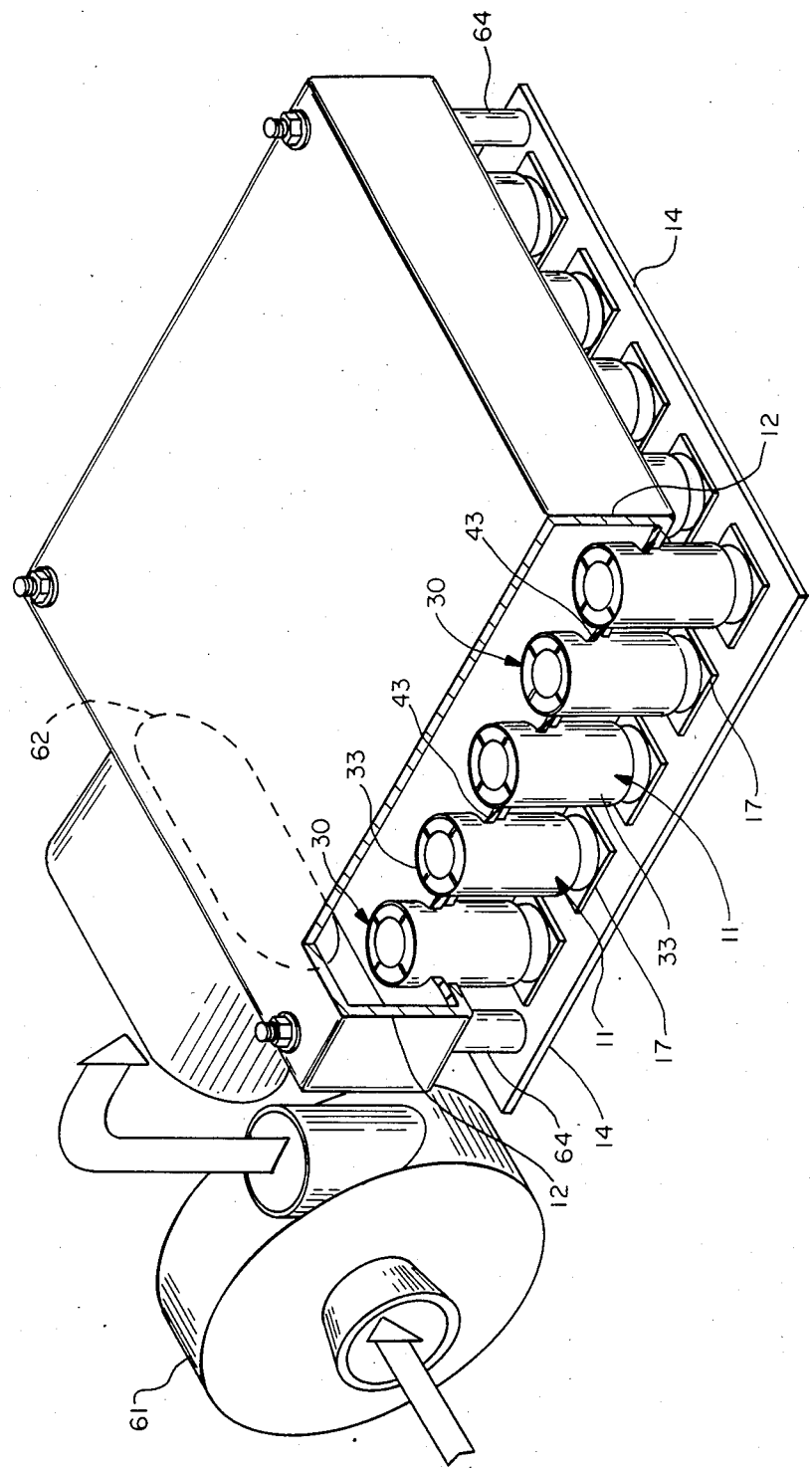
FIG.—3

HEAT PIPE HEAT EXCHANGER FOR LARGE SCALE INTEGRATED CIRCUITS

FIELD OF THE INVENTION

The present invention relates to apparatus for dissipating heat from large scale integrated circuits. Particularly, the field of the invention is heat exchangers which employ heat pipes to remove heat from integrated circuit devices.

BACKGROUND OF THE INVENTION

Integrated circuits are being developed which have large numbers of discrete components in very small areas and which operate at faster and faster speeds. As the number of components and the speed of those components have increased, the power at which the integrated circuit chips have operated has also increased. High power operation generates heat which must be dissipated into the atmosphere to prevent overheating of the integrated circuit.

As an integrated circuit heats up, the operating characteristics of the circuit changes. Thus it is important in the large scale integration industry to provide a heat exchanger which will maintain the temperature of the integrated circuit within an acceptable range.

Prior art heat exchangers can be loosely divided into two broad categories. The first category is for liquid-cooled systems which flow a liquid coolant across heat sinks mounted with the integrated circuits. The second category includes air or gas cooling mediums which are blown across the heat sinks of the integrated circuits.

The prior art liquid-cooled systems while providing good heat transfer capability are very bulky, heavy and messy when used in connection with integrated circuits. Furthermore the liquid-cooled systems require that the heat be first transferred from a heat sink connected to the integrated circuit to the liquid cooling medium and then from the liquid cooling medium into the atmosphere. Thus there is required additional equipment for radiating heat from the cooling medium to the atmosphere.

On the other hand, air-cooled systems in the prior art while relatively lightweight and simple compared to liquid-cooled systems, are limited by the amount of heat which can effectively be dissipated directly into the atmosphere. The prior art air-cooled system is exemplified by U.S. Pat. No. 4,115,837 ('837 patent) owned by Amdahl Corporation which is also the assignee of the present invention. In the '837 patent, the heat exchanger comprises a cooling stud made of a solid material that conducts heat readily which is attached to a substrate supporting an integrated circuit chip. The heat is conducted into the cooling stud and air is forced across the cooling stud to remove heat to the atmosphere. Cooling fins can be attached to the cooling stud to increase the surface area for dissipation of heat by the heat exchanger in that air-cooled system. The arrangement of the '837 patent has proved satisfactory for integrated circuits which generate smaller amounts of heat. However as the amount of heat generated by integrated circuits increases, the prior art air-cooled system becomes less useful.

Accordingly, there is a need for a heat exchanger system for integrated circuits which will dissipate large amounts of heat using an air or gas cooling medium, or on the other hand, which will require small amounts of liquid cooling medium in order to dissipate large amounts of heat.

SUMMARY OF THE INVENTION

The present invention provides a packaging apparatus for conducting heat away from an integrated circuit into a cooling medium comprising a heat pipe means for conducting heat away from the integrated circuit. The heat pipe means includes a heat pipe with a proximal end mounted in good heat transfer relation with the integrated circuit and a distal end to which the heat is conducted away from the integrated circuit. A plenum means for causing a cooling medium to flow across the distal end of the heat pipe in order to remove heat from the heat pipe means is provided.

In one embodiment, a plurality of radial cooling fins are formed on the heat pipe means adjacent the distal end of the heat pipe. The cooling fins extend along an axis extending from the distal end to the proximal end of the heat pipe. The flow guide means for guiding the flow of the cooling medium from the plenum means encloses the plurality of radial cooling fins to form axial channels between the radial cooling fins along the axis. The cooling medium is thus guided through these axial channels to remove heat from the heat pipe means.

In an alternative embodiment, rather than the radial cooling fins, at least one helical cooling fins is formed around the axis of the heat pipe extending from adjacent the distal end toward the proximal end. The flow guide means encloses the at least one helical cooling fin to form a helical channel passing around the heat pipe means across the helical cooling fin to remove heat from the heat pipe means.

BRIEF DESCRIPTION OF THE DRAWINGS

FIG. 2 is a drawing of one embodiment of the present invention with helical cooling fins forming helical channels for guiding the flow of the cooling medium.

FIG. 3 is a drawing of the present invention as implemented for a plurality of integrated circuits.

DETAILED DESCRIPTION

Figure 1:
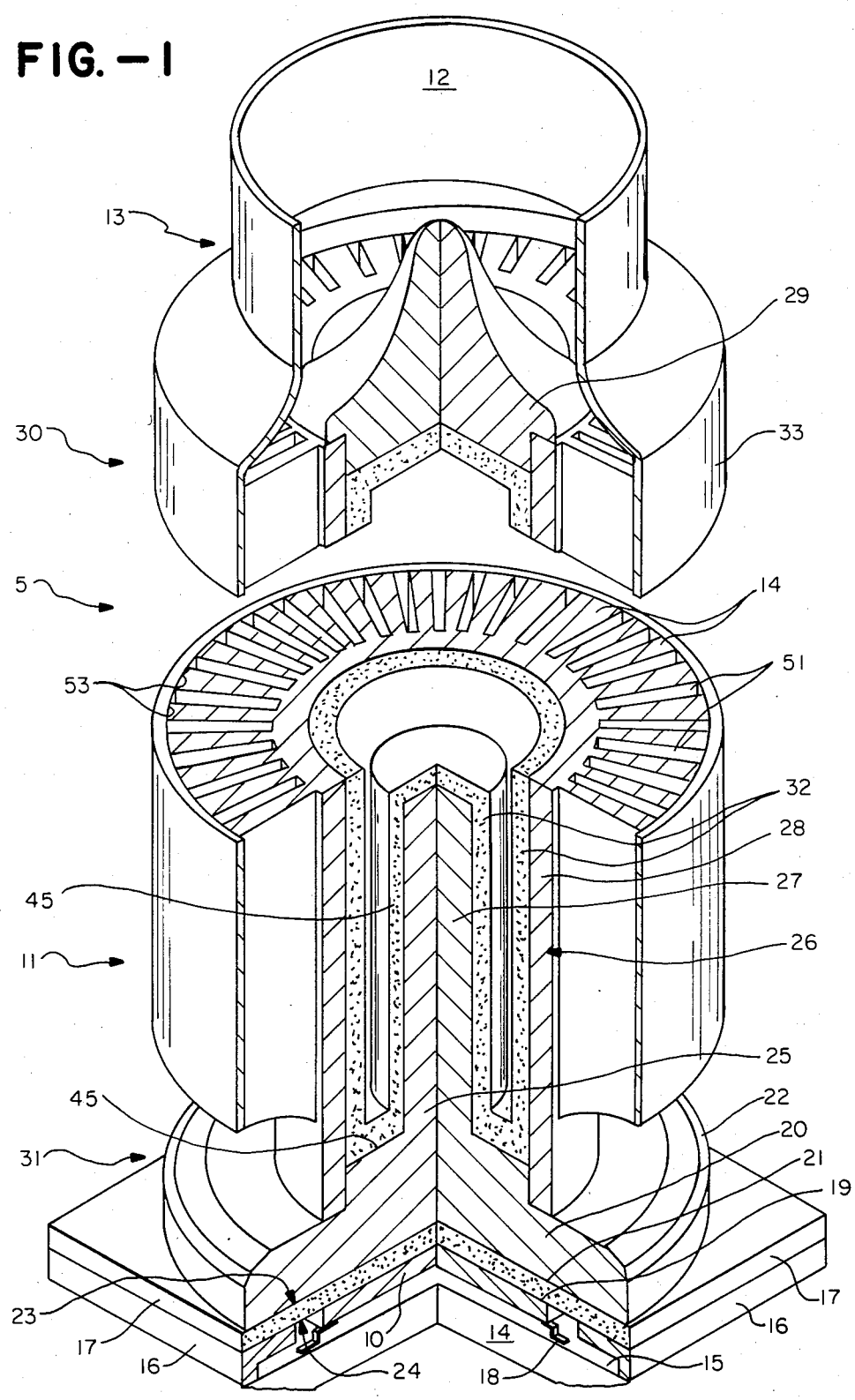
FIG. 1 is a drawing of one embodiment of the present invention showing radial cooling fins forming axial channels formed for guiding the flow of the cooling medium.

With reference to the Figures, a detailed description the packaging apparatus 5 of the present invention is provided. Since the invention pertains to the conduction of heat away from integrated circuits, the structure of the embodiments of the present invention shown in the Figures is described from the integrated circuit 10, proceeding through the heat pipe means 11 to the plenum means 12 and the flow guide means 13.

As shown in FIG. 1, the integrated circuit 10 is mounted on a circuit board 14 or other carrier means for electrical isolation and support of the integrated circuit chip 10. In the embodiment shown in FIG. 1, the integrated circuit chip 10 is mounted in a cavity 15 defined by the circuit board 14, spacers 16, and a substrate 17. The spacers 16 serve to hold the substrate 17 spaced above the circuit board 14 to form the cavity 15 for the integrated circuit chip 10. The integrated circuit chip 10 communicates with circuits (not shown) on the circuit board 14 through tabs 18. The integrated circuit chip 10 is bonded, for instance by soldering, to a first side 24 of the substrate 17 at interface 19 which facilitates the conduction of heat from the integrated circuit chip 10 to the substrate 17. There are a variety of solders known in the art which can be used for this purpose.

The substrate 17 is preferably formed of a material which is an electrical insulator that readily conducts heat, such as BeO.

A base 20 of the heat pipe means 11 constructed of readily heat-conducting material, such as copper or other metal, is bonded to the substrate 17 in good heat transfer relation, such as by soldering, along interface 21 on the second side 23 of the substrate 17. As can be seen in FIG. 1, the solder interface 21 and a circular lower part 22 of the base 20 cover an area on the second side 23 of the substrate 17 which is larger than the area of the interface 19 on the first side 24 of the substrate 17 to which the integrated circuit chip 10 is bonded. In this manner, it is assured that heat generated by the integrated circuit chip 10 as it is conducted through the substrate 17 passes into the readily conducting base 20 of the heat pipe means 11.

The base 20 of the heat pipe means 11 shown in FIG. 1 is plug-shaped to serve as the base plug 25 of a heat pipe 26 having cylindrical outer wall 28 constructed of a readily heat-conducting material such as copper. The proximal end 31 of the heat pipe 26 is thus enclosed by the fit of the cylindrical outer wall 28 with the base plug 25 on the base 20. Further the base plug 25 of the heat pipe 26 in the embodiment shown in FIG. 1 includes a heat pipe core 27. The heat pipe core 27 is a means for providing a large surface area inside the heat pipe 26 proximal to the source of heat in the integrated circuit 10.

The cylindrical wall 28 of the heat pipe 26 is sealed at the distal end 30 with a cap 29 of readily heat-conducting material such as copper.

The inside of the heat pipe 26 is evacuated and then a liquid heat carrier (not shown) for the conduction of heat is placed inside according to well-known heat pipe design techniques.

The interior of the heat pipe 26 is lined by a capillary structure or wick means 32 for transporting the liquid heat carrier of the heat pipe means 11. The wick means 32 can be formed of a porous material or of a network of grooves on the interior surface of the heat pipe 26. The wick means 32 should be designed to provide capillary forces for conducting the liquid heat carrier of the heat pipe 26 from an area adjacent the distal end 30 back to the proximal end 31.

The plenum means 12 causes a flow of a cooling medium, preferrably air, across the distal end 30 of the heat pipe means 11.

The flow guide means 13 directs the flow of the cooling medium across the heat pipe means 11. As can be seen in FIG. 1, the flow guide means 13 is a cylindrical guide 33 which receives the cooling medium from the plenum means 12 and guides its flow across a plurality of radial cooling fins 41. The radial cooling fins 41 are formed adjacent the distal end 30 of the heat pipe means 11 along an axis extending from the distal end 30 toward the proximal end 31 of the heat pipe means 11. The radial cooling fins 41 do not reach completely to the base part 20 of the heat pipe means 11 so that the cooling medium can escape. The plurality of radial cooling fins 41 form axial channels 51 along the heat pipe 26 through which the cooling medium is caused to flow to remove heat from the heat pipe means 11. The plurality of radial cooling fins 41 can be formed of any suitable readily heat-conducting material such as copper. The flow guide means 13 would likewise be manufactured of a readily heat-conducting material and bonded to the outer edge 53 of the cooling fins 41 in the preferred embodiment.

To minimize turbulence in the flow of the cooling medium into the flow guide means 13 from the plenum means 12, the cap 29 of the heat pipe 26 is formed with the cone shape as shown in FIG. 1. It is desirable to reduce the turbulence of the cooling medium in the transition as it flows from the plenum means 12 into the flow guide means 13 in order to minimize noise levels of the packaging apparatus 5 of the present invention for the embodiment shown in FIG. 1.

In operation, as heat is generated in the integrated circuit 10, it is conducted through the substrate 17 into the base 20 of the heat pipe means 11. Since the base 20 is an excellent conductor of heat, the inside surface 45 of the heat pipe 26 adjacent the proximal end 31 and along the heat pipe core 27 is essentially isothermal providing a large surface 45 adjacent the proximal end 31 of the heat pipe means 11. The liquid heat carrier in the heat pipe 26 is evaporated from this large surface 45 adjacent the proximal end 31 of the heat pipe means 11 and transported toward the distal end 30 of the heat pipe means 11. At the distal end 30, the liquid carrier is condensed, releasing the heat which had been collected from the proximal end 31 in the form of latent heat of evaporation, into the heat pipe cap 29 and the cylindrical wall 28 of the heat pipe 26 adjacent the distal end 30. The liquid heat carrier of the heat pipe 26 is then transported by capillary action of the wick means 32 back to the proximal end 31 of the heat pipe 26 where it evaporates again collecting heat in the form of latent heat of evaporation and the cycle continues.

The heat which is transported from the proximal end 31 to the distal end 30 of the heat pipe means 11 is rapidly conducted into the plurality of radial cooling fins 41. The cooling medium from the plenum means 12 is forced to flow through the axial channels 51 defined by the flow guide means 13 between the radial cooling fins 41 to transfer heat away from the heat pipe means 11 to the atmosphere.

The cooling medium for the embodiment shown in FIG. 1 is preferably air which is forced to flow through the axial channels 51 at a velocity sufficient to remove heat from the heat pipe means 11 at a heat transfer rate equal to or greater than that at which the integrated circuit 10 generates heat. In this manner the temperature of the integrated circuit chip 10 is controlled. The larger the amount of heat that must be dissipated, the higher the velocity of air flow that is required to remove heat from the heat pipe means 11.

As is known in the art, the efficiency of the conduction of heat from a cooling fin to the cooling medium increases when the flow across the cooling fin becomes a turbulent flow. Accordingly for removing higher quantities of heat, the air flow through the axial channels 51 defined by the flow guide means 13 around the plurality of radial cooling fins 41 is high enough so that it results in turbulent flow through the channels 51. However, the shape of the cap 29 is such that the transition of the flow of the cooling medium from the plenum means 12 through the channels 51 between the plurality of radial cooling fins 41 occurs with a minimum amount of turbulence, thereby minimizing the noise caused by the packaging apparatus 5 of the present invention.

An alternative embodiment of the packaging apparatus 5 of the present invention is shown in FIG. 2. In a manner similar to that described in FIG. 1, the integrated circuit chip 10 is mounted on the first side 24 of a substrate 17. The cacity 15 for the integrated circuit 10 is formed by enclosure 55. Tabs 56 support the enclosure 55 and provide electrical communication to the carrier means (not shown).

On the second side 23 of the substrate 17 the heat pipe means 11 is bonded. A plenum means 12 causes the flow of a cooling medium, preferably air, across the heat pipe means 11. A flow guide means 13 directs the flow of the cooling medium across the heat pipe means 11 in order to maximize the efficiency of the transfer of heat from the heat pipe means 11 to the cooling medium. The base 20 of the heat pipe means 11 is bonded to the substrate 17 on the second side 23 across a interface 21 which covers an area much larger than the interface 19 between the integrated circuit chip 10 and the first side 24 of the substrate 17.

The heat pipe means 11 includes a heat pipe 26 formed by a cylindrical wall 28 sealed by a base plate 55 on a proximal end 31 of the heat pipe means 11 in close proximity to the integrated circuit chip 10. The heat pipe 26 is mounted in good heat transfer relation with the integrated circuit chip 10. The distal end 30 of the heat pipe 26 is sealed by a cap 29.

As explained above, the heat pipe is evacuated, and a liquid heat carrier is placed inside the heat pipe 26 is accordance with well known principals of heat pipe design.

The interior of the heat pipe 26 is lined with a wick means 32 for transporting the liquid heat carrier via capillary action or otherwise as explained above.

In contrast to the embodiment shown in FIG. 1, the embodiment shown in FIG. 2 includes four helical cooling fins with 40A, 40B, 40C, 40D which are formed around the cylindrical wall 28 of the heat pipe 26 along an axis extending from the distal end 30 toward the proximal end 31 of the heat pipe means 11. The flow guide means 13 is a cylindrical guide 33 which encloses the four helical cooling fins, 40A, 40B, 40C, 40D to form helical channels 42A, 42B, 42C, 42D passing around the heat pipe 26 for guiding the flow of the cooling medium across the helical fins 40A-40D to maximize the transfer of heat from the helical cooling fins 40A-40D to the heat cooling medium.

As shown in FIG. 2, the plenum means 12 for an air cooled packaging apparatus 5 can be formed by providing a large reservoir for the cooling medium which is sealed to the flow guide means 13 by a rubber seal 43 and supported using plastics or other suitable structural material for a support 44. The structure and function of the plenum means 12 is described in more detail below with reference to FIG. 3.

Unlike FIG. 1, the embodiment shown in FIG. 2 illustrates a heat pipe 26 without the core 27 shown in FIG. 1. Likewise in FIG. 2, the inside surface 45 proximal to the integrated circuit chip 10 is located much closer to the chip 10 than the embodiment shown in FIG. 1. The particular design parameters of the user system would determine the choice of the alternative forms of the proximal end 31 of the heat pipe 26. The less distance between the integrated circuit chip 10 and the inside surface 45 of the heat pipe 26 proximal to the integrated circuit, the more efficient the transfer of heat away from the integrated circuit 10 to the proximal end 31 of the heat pipe 26. However, the efficiency of the transfer of heat by the heat pipe 26 is increased when the surface area 45 inside the heat pipe 26 adjacent the proximal end 31 of the heat pipe means 11 is increased, such as by the core 27 shown in FIG. 1.

In operation, the embodiment shown in FIG. 2 conducts heat from the integrated circuit chip 10 into the heat pipe 26 where the liquid heat carrier evaporates and carries heat in the form of latent heat of evaporation toward the distal end 30 of the heat pipe means 11. At the distal end 30, the liquid heat carrier condenses releasing the heat which it collected at the proximal end 31 into the cylindrical wall 28 and cap 29 of the heat pipe 26. From there it is conducted out into the helical cooling fins 40A-40D. The plenum means 12 supplies pressurized air over the openings of the helical channels 42A-42D so that the cooling medium, air, flows through the helical channels 42A-42D around the heat pipe 26 and over the helical cooling fins 40A-40D and out near the proximal end 31 of the heat pipe means 11 to the atmosphere. As the cooling medium flows through the channels 42A-42D, the heat is transferred from the helical cooling fins 40A-40D to the cooling medium. In this manner the heat generated in the integrated circuit 10 is transferred to the cooling medium rapidly and efficiently.

The amount of heat which must be transferred to the cooling medium is determined by the amount of heat which is generated by the integrated circuit chip. The amount of heat which the packaging apparatus 5 of the embodiment shown in FIG. 2 will transfer is determined in part by the velocity of flow of the cooling medium through the helical channels 42A-42D. As explained above, if the velocity of flow is sifficient to cause turbulent flow through the channels 42A-42D, then the efficiency of the transfer of heat from the helical cooling fins 40A-40D to the cooling medium is increased.

FIG. 3 shows a schematic diagram of the present invention as employed for cooling a plurality of integrated circuit chips. A carrier means, such as the circuit board 14 in the embodiment shown in FIG. 3, supports a plurality of integrated circuits each mounted on an individual substrate 17 and having heat pipe means 11 mounted for conducting heat away from the integrated circuit. The heat pipe means 11 are formed as discussed above with reference to FIGS. 1 or 2. FIG. 3 illustrates a carrier having twenty five heat pipe means 11 mounted on it, each of the heat pipe means 11 having four helical cooling fins (42A-42D in FIG. 2) enclosed by flow guide means 33.

A plenum 12 in a form of a substantially rectangular box is mounted with the heat pipe means 11 for supplying a cooling medium in parallel to each of the heat pipe means 11 mounted on the circuit board 14. The plenum 12 is formed so that it is sealed to the flow guide means 33 of each of the heat pipe means 11 such as by rubber seals 43 (See FIG. 2). Thus the cooling medium flows out of the plenum 12 through the individual flow guide means 33 across the heat pipe means 11 and out to the atmosphere 63 for each of the integrated circuits on the circuit board 14.

For an air cooling medium, a blower 61 is mounted for feeding air into the plenum means 12 at a desired volume and pressure. If the user desires to increase the efficiency or amount of the heat transfer, an air conditioner (not shown) can be added for providing cooled air to the blower 61.

The plenum 12 is formed so that the cross-sectional area 62 of the opening through which the air is supplied from the blower 61 is greater than the combined cross-sectional area of the channels (51 in FIG. 1, 42A-42D in FIG. 2) in the heat pipe means 11 through which the cooling medium flows. In this manner the plenum 12 will operate to equalize the pressure of the air cooling medium throughout the plenum 12 and supply equal amounts of cooling medium to each of the heat pipe means 11 in parallel. For instance, the cross-sectioal area 62 could be formed about one and a half times greater than the combined cross-sectional area of the channels that open to the atmosphere 63.

For some embodiments, the user may desire to reverse the blower 61 to cause the plenum 12 to create a suction so that the air or other cooling medium is drawn up through the flow guide means 13 into the plenum 12 and then pumped away from the plenum 12 through the blower 61. Thus, the flow can be reversed, drawing the air cooling medium away from the substrate 17 and the circuit board 14 through the blower 61 out into the atmosphere.

The plenum 12 is preferably formed of a rigid material such as a plastic or metal and supported over the heat pipe means 11 by supports 64 to provide ample space 63 for the flow of the cooling medium away from or into the heat pipe means 11 as necessary. The plenum 12 would be sealed to each of the flow guide means 33 by the rubber seals 43 as discussed with reference to FIG. 2 or otherwise. The variety of methods for sealing the flow guide means 13 to the plenum 12 are known in the art and the particular method used would depend in part on the particular materials used to form the flow guide means 13 and the plenum 12 and on the pressure exerted on the cooling medium in the plenum 12.

The plenum 12 should be large enough and have a shape such that it will tend to provide equal volumes of cooling medium at essentially equal temperature to each of the heat pipe means 11 on the circuit board 14 with which it is mounted. In this manner the user is assured that all of the integrated circuits on the circuit board 14 will each achieve essentially equal heat dissipation. The user may if desired alter the shape or design of the plenum 12 to control the volume of the flow of the cooling medium to selected heat pipe means 11 on the carrier.

In operation, a cooling medium is supplied to the plenum 12. For an air cooling medium, a pressure is established in the plenum 12 which tends to force the air out through the channels of the heat pipe means 11. As the air flows through the channels of the heat pipe means 11 across the cooling fins (41, 42 and FIGS. 1 and 2, respectively) heat is transferred from the heat pipe means 11 to the cooling medium. The air cooling medium then flows out the proximal end 31 of the channels (51 in FIG. 1, 42A–42D in FIG. 2) to the atmosphere 63 where it is diffused away from the integrated circuit. Parameters which effect the amount of heat which is transferred include, among others, the temperature of the cooling medium, the surface area of the cooling fins, the velocity of flow of the cooling medium across the cooling fins, the temperature at which the heat pipe means 11 transfers heat to the cooling fins, and the efficiency of the conduction of heat by the heat pipe means 11.

Accordingly, the user may adapt the system of the present invention to meet the needs of particular power dissipation. For instance, the user may alter the number and configuration of the cooling fins as illustrated by the alternative embodiments of FIGS. 1 and 2. Also, the user may cool the cooling medium to a selected temperature to provide for greater dissipation of heat. The user may employ heat pipe core 27 as illustrated in FIG. 1. Further, the user may increase the volume of flow of the cooling medium through the channels of the heat pipe means 11 by increasing the power of the blower 61 or other means supplying the cooling medium to the heat pipe means 11.

Preliminary engineering calculations for a packaging apparatus 5 such as shown in FIG. 3 affirm that superior heat transfer characteristics are attained. Assuming an integrated circuit chip with a power dissipation of 25 watts per chip and having a maximum junction temperature of 65 degrees centigrade with an air cooling medium at 20 degrees centigrade, a heat transfer coefficient of 14.9 btu/hr.ft$^2$ °F. is needed to maintain the junction temperature. For a heat pipe 26 with an outer diameter of 0.5 inches a total height from the proximal to distal ends of 1.9 inches and having four radial cooling fins extending to an outer diameter of 0.8 inches, it is found that with an air velocity through the helical channels 42A–42D of 110 feet per second or 2.05 cubic feet per minute per chip, the heat transfer coefficient is approximately 2.34 times better than required. For an air velocity through the helical channels 42A–42D of 200 feet per second or 3.73 cubic feet per minute per chip, the heat transfer coefficient is approximately 3.77 times better than required. For the system for which the preliminary calculations were made having helical cooling fines 42A–42D, the minimum pressure drop through the heat pipe means is approximately 0.82 inches of water and the maximum pressure drop is approximately 2.7 inches of water. For the embodiment employing axial cooling fins 41 (FIG. 1), the pressure drop will be less, and higher velocities of air will be required for the same sized packages. This preliminary calculation information is provided to demonstrate the superior performance of the present invention, but it is not represented that upon testing the actual device according to the present invention that identical results will be obtained. It is believed that the calculations are in the range of preliminary engineering practice.

The present invention provides a packaging apparatus for integrated circuits which provides highly efficient heat dissipation and is adaptable to a variety of configurations. The increased efficiency of the packaging apparatus for dissipating heat of the present invention allows the use of air as a cooling medium for higher power dissipation than prior art air cooled systems are able to achieve. Also lower volumes of cooling medium, liquid or air, are required than prior art systems for a given heat dissipation.

The user may wish to use a liquid cooling medium such as water. If so, the blower 61 would be replaced with a suitable pump and a means for providing return flow of the liquid cooling medium would be required. Also a means for radiating heat from the liquid cooling medium to the atmosphere would be used. For a liquid cooling medium, the superior heat transfer characteristics of the present invention allow the use of smaller volumes of cooling liquid per unit heat dissipation, thereby, the heat transfer apparatus according to the present invention having a liquid cooling medium will be smaller and lighter weight than prior art systems.

In the preferred embodiment, the heat pipe means 11 is oriented so that the distal end 30 is vertically above the proximal end 31 so that the capillary flow of the liquid heat carrier inside the heat pipe 26 is not hindered by gravity.

The present invention has been described with respect to the preferred embodiment thereof and the alternative forms employing radial or helical cooling fins and other features, but the invention is not meant to be limited by the description herein. The invention is entitled to protection within the full scope of the claims appended hereto.

Other aspects, advantages and characteristics of the present invention can be seen by study of the claims, the specification and the drawings.

We claim:

1. A packaging apparatus conducting heat from an integrated circuit to a cooling medium, comprising:
    heat pipe means, including a heat pipe, with a proximal end and a distal end mounted with said proximal end in good heat transfer relation with an integrated circuit for conducting heat away from the integrated circuit to said distal end;
    plenum means causing the cooling medium to flow across said distal end for removing heat from said heat pipe means;
    at least one cooling fin formed on said heat pipe means adjacent to said distal end; and
    flow guide means bonded to said at least one cooling fin for guiding the flow of the cooling medium between said plenum means and said distal end, said flow guide means substantially enclosing said at least one cooling fin such that at least one channel is defined adjacent to said heat pipe means, said channel defining a flow path for the flow of the cooling medium, the flow path extending substantially between said distal end and said proximal end.

2. The packaging apparatus of claim 1, wherein:
    a plurality of radial cooling fins are formed on said heat pipe means adjacent said distal end along an axis, said axis extending from said distal end toward said proximal end.

3. The packaging apparatus of claim 1, wherein:
    at least one helical cooling fin is formed on said heat pipe means adjacent said distal end around an axis, said axis extending from said distal end toward said proximal end.

4. The packaging apparatus of claim 2, wherein:
    said flow guide means substantially encloses and is bonded to a plurality of radial cooling fins to define a plurality of channels between said radial cooling fins, along an axis which extends substantially between said distal end and said proximal end, for receiving the flow of the cooling medium.

5. The packaging apparatus of claim 3, wherein:
    said flow guide means substantially encloses said at least one helical cooling fin to define at least one helical channel around said heat pipe means, and around an axis which extends substantially between said distal end and said proximal end, for receiving the flow of the cooling medium.

6. The packaging apparatus of claim 1 further comprising:
    turbulence reduction means adjacent to the distal end of said heat pipe means for reducing the turbulence of cooling medium flow in a region adjacent to the distal end.

7. The packaging apparatus of claim 6 wherein:
    said turbulence reduction means comprises a substantially cone-shaped member.

8. The packaging apparatus of claim 1 wherein both said at least one fin and said flow guide means are formed from heat conducting materials.

9. A packaging apparatus dissipating heat from a plurality of integrated circuits, comprising:
    a plurality of respective heat pipe means, each including a heat pipe, with a proximal end and a distal end mounted with said proximal end in good heat transfer relation with at least one of a plurality of integrated circuits for conducting heat away from the integrated circuit, each respective heat pipe further including at least one cooling fin formed on said respective heat pipe means adjacent to a respective distal end thereof;
    a cooling medium for removing heat from said plurality of heat pipe means;
    plenum means supplying said cooling medium in parallel to each of said plurality of heat pipe means; and
    a plurality of respective flow guide means, each associated with a respective one of said heat pipe means and each flow guide means bonded to its respective heat pipe means for guiding the flow of the cooling medium between said plenum means and respective distal ends of said heat pipe means, each flow guide means substantially enclosing at least one cooling fin of an associated respective heat pipe means such that at least one respective channel is defined adjacent to the associated respective heat pipe means, the channel defining a flow path for the flow of the cooling medium, the flow path extending substantially between a distal end and a proximal end of the associated respective heat pipe means.

10. The packaging apparatus of claim 9, wherein:
    a plurality of radial cooling fins are formed on at least one of said plurality of heat pipe means adjacent said distal end along an axis, said axis extending from said distal end toward said proximal end.

11. The packaging apparatus of claim 9, wherein:
    at least one helical cooling fin is formed on at least one of said plurality of heat pipe means adjacent said distal end around an axis, said axis extending from said distal end toward said proximal end.

12. The packaging apparatus of claim 10, wherein:
    a respective of said flow guide means substantially encloses and is bonded to said plurality of radial cooling fins, formed on said at least one of said plurality of heat pipe means, to form axial channels between said plurality of radial cooling fins along the axis of said at least one heat pipe for receiving the flow of the cooling medium.

13. The packaging apparatus of claim 11, wherein:
    a respective of said flow guide means substantially encloses said at least one helical cooling fin, formed on said at least one of said plurality of heat pipe means, to form at least one helical channel around the axis of said at least one heat pipe for receiving the flow of the cooling medium.

14. A packaging apparatus dissipating heat from a plurality of integrated circuits, comprising:
    carrier means for supporting a plurality of integrated circuit packages;
    said packages including,
        substrate means supporting at least one of the plurality of integrated circuits, and having a first side and a second side, mounting means mounting at least one of the plurality of integrated circuits in good heat transfer relation with said substrate means first side, and a heat pipe means, including a heat pipe, with a proximal end and a distal end, said proximal end mounted in good heat transfer relation with said substrate means on said second side, for conducting heat away from said substrate means;

a cooling medium for removing heat from said plurality of packages;

plenum means causing said cooling medium to flow in parallel across the distal end of said heat pipe means of each of said plurality of packages for removing heat from said heat pipe means;

at least one cooling fin formed on a heat pipe means of at least one package adjacent to said distal end; and flow guide means bonded to said at least one cooling fin for guiding the flow of the cooling medium between said plenum means and said distal end of said at least one package, said flow guide means substantially enclosing said at least one cooling fin such that at least one channel is defined adjacent to said heat pipe means of said at least one package, said channel defining a flow path for the flow of the cooling medium, the flow path extending substantially between said distal end and said proximal end of said at least one heat pipe means of said at least one package.

15. The packaging apparatus of claim 14, wherein:
a plurality of radial cooling fins are formed in at least one of said plurality of packages on said heat pipe means adjacent said distal end along an axis, said axis extending from said distal end toward said proximal end.

16. The packaging apparatus of claim 14, wherein:
at least one helical cooling fin is formed in at least one of said plurality of packages on said heat pipe means adjacent said distal end around an axis, said axis extending from said distal end toward said proximal end.

17. The packaging apparatus of claim 14, wherein:
said heat pipe means includes a base made of readily heat conducting material formed on said proximal end having a bonding surface for bonding to said second side of said substrate means, said bonding surface having an area greater than the said at least one integrated circuit mounted on said first side.

18. The packaging apparatus of claim 15, wherein:
said flow guide means substantially encloses and is bonded to a plurality of radial cooling fins to define a plurality of channels, which extends substantially between said distal end and said proximal end between said radial cooling fins, for receiving the flow of the cooling medium.

19. The packaging apparatus of Claim 16, wherein:
said flow guide means substantially encloses said at least one helical cooling fin to define at least one helical channel around said axis for receiving the flow of the cooling medium.

20. The packaging apparatus of claim 17, wherein:
said base of said heat pipe means includes a heat pipe core which upstands from said base and protrudes inside said heat pipe means.

21. The packaging apparatus of claim 17, wherein:
said base defines a recessed region adjacent to the said at least one integrated circuit mounted on the first side of said substrate means; and
wherein said heat pipe means includes an inner wall extending between said distal end and said proximal end.

* * * * *